United States Patent [19]

Hite

[11] Patent Number: 5,103,283
[45] Date of Patent: Apr. 7, 1992

[54] PACKAGED INTEGRATED CIRCUIT WITH IN-CAVITY DECOUPLING CAPACITORS

[76] Inventor: Larry R. Hite, 6700 Gold Dust Trail, Dallas, Tex. 75252

[21] Appl. No.: 587,595

[22] Filed: Sep. 24, 1990

Related U.S. Application Data

[63] Continuation of Ser. No. 297,797, Jan. 17, 1989, abandoned.

[51] Int. Cl.$^5$ .................. H01L 27/02; H01L 23/02; H01L 23/12
[52] U.S. Cl. ........................................ 357/51; 357/74
[58] Field of Search .............. 357/74, 69, 75, 51, 357/75; 361/330

[56] References Cited

U.S. PATENT DOCUMENTS

| | | | |
|---|---|---|---|
| 3,500,066 | 3/1970 | Pritchett | 357/75 |
| 3,501,832 | 3/1970 | Iwata et al. | 357/75 |
| 3,784,884 | 1/1974 | Zoroglu | 357/75 |
| 3,838,443 | 9/1974 | Laighton | 357/81 |
| 3,893,159 | 7/1975 | Martin | 357/74 |
| 3,969,752 | 7/1976 | Martin et al. | 357/80 |
| 4,042,952 | 8/1977 | Kraysill | 357/80 |
| 4,107,728 | 8/1978 | Max | 357/74 |
| 4,150,393 | 4/1979 | Wilson et al. | 357/74 |
| 4,303,934 | 12/1981 | Stitt | 357/75 |
| 4,417,386 | 11/1983 | Exner | 357/71 |
| 4,451,845 | 5/1984 | Philofsky et al. | 357/75 |
| 4,551,747 | 11/1985 | Gilbert et al. | 357/74 |

FOREIGN PATENT DOCUMENTS

| | | | |
|---|---|---|---|
| 131345 | 2/1949 | Australia | 361/330 |
| 55-061046 | 5/1980 | Japan | 357/75 |
| 55-086141 | 6/1980 | Japan | 357/75 |

Primary Examiner—Andrew J. James
Assistant Examiner—Donald L. Monin, Jr.
Attorney, Agent, or Firm—Robby T. Holland; Rene'E. Grossman; Richard L. Donaldson

[57] ABSTRACT

An integrated circuit package is disclosed which has decoupling capacitors mounted within the cavity. A first embodiment has a thin-film capacitor mounted to the die attach of the header, with a first wire bond connecting the top surface to a lead finger of the header, and with a second wire bond connecting the top surface to the semiconductor chip mounted in the package. A second embodiment allows for decoupling of the power supply to a reference voltage other than that of the substrate, by providing a stacked capacitor where the top capacitor has a smaller cross-sectional area than the lower capacitor. Bond wires connect the top surface of the top capacitor to a first power supply lead, such as $V_{cc}$, and to the $V_{cc}$ bond pad of the chip. The top surface of the lower capacitor, and consequently the lower surface of the top capacitor, are connected by bond wires to the reference supply ($V_{ss}$) lead of the package and bond pad of the chip.

5 Claims, 5 Drawing Sheets

PACKAGED INTEGRATED CIRCUIT WITH IN-CAVITY DECOUPLING CAPACITORS

This invention was made with Government support under contract No. DNA 001-86-C-0090 awarded by the Defense Nuclear Agency. The Government has certain rights in this invention.

This application is a continuation, of application Ser. No. 07/297,797, filed Jan. 17, 1989, now abandoned.

This invention is in the field of integrated circuits, and is more specifically directed to packages for integrated circuit chips.

This invention was made with Government support under contract No. DNA 001-86-C-0090 awarded by the Defense Nuclear Agency. The Government has certain rights in this invention.

BACKGROUND OF THE INVENTION

In the field of integrated circuits, in order for the integrated circuit chip to be mounted into its end equipment, and in order for conventional solder connection to be made to the integrated circuit chip, packages are used to house the integrated circuit chip. These packages, such as the well-known dual-in-line (DIP) packages, leadless chip carriers, pin-grid array packages, and other conventional packages, each have leads or terminals which can be connected to a printed circuit board or other piece of equipment. Within the package, connection is made, generally by way of wire bonding, between the external leads or terminals of the package and the integrated circuit chip itself.

Even for the short length between the external terminals of the package and the integrated circuit chip, via the wire bond and the run within the package body from the lead finger to the external terminal, parasitic inductance is present. The high switching speeds of modern digital circuits result in relatively high levels of instantaneous current required to perform the switching operation. The rate of change of current required from a power supply to effect the switching will, due to the presence of finite inductance from the package run and the bond wires, as well as from any external wires or other conductors connected to the power supply terminals of the packaged integrated circuit, result in modulation of the power supply voltage since the current through an inductor cannot change instantaneously. The modulation of the voltage will, of course, be equal to the product of the inductance and the time rate of change of the current through the conductor. This modulation of the power supply voltage, commonly referred to as power supply noise, can upset the operation of the integrated circuit if it is of sufficient magnitude.

Other causes of power supply noise include the exposure of the integrated circuit to transient radiation. A transient radiation event will cause normally off MOS transistors to conduct from source-to-drain in a manner equivalent to photoconduction (i.e., generation of electron-hole pairs). Due to the nature of the transient radiation event, the net current of the generated electrons traveling to the positive power supply and of the generated holes traveling to ground will have a large time rate of change. Similarly as the time rate of change of the switching current of the circuit, the time rate of change of the current due to the transient radiation event will result in modulation of the power supply potential from the inductance of the power supply leads. In an integrated memory circuit such as a static RAM which is exposed to such a transient dose, if the noise due to the photoconduction is of sufficient amplitude to cause the power supply voltage to drop below a certain level, this noise, or sag, may cause loss of the data stored in the static memory cells.

Prior techniques to reduce power supply noise from internal operation, as well as from external sources such as transient radiation, have included the connection of decoupling capacitors between the power supply terminals external to the integrated circuit package. Another prior technique has been the connection of small capacitors within the cavity of the integrated circuit package. In this prior technique, the connection of the capacitor to power supply leads of the package has been made by providing connection internal to the package header between the external leads and pads located within the package cavity, so that the capacitor can be mounted within the cavity in such a manner that both plates are connected to the pads in the cavity. Connection between the header and the chip is made directly by wire bonds, in the same manner as would be made if the capacitors were not present. While such decoupling capacitors are effective in reducing the magnitude of the noise or sag, significant parasitic inductance still remains between the external terminal and the integrated circuit chip, so that noise and sag from these causes may still affect the operation of the circuit.

It is therefore an object of this invention to provide decoupling capacitors as close as possible to the integrated circuit chip within a package.

It is yet another object of this invention to provide such capacitors which are assembled within the package using the same techniques as used for assembling the associated integrated circuit chip within the package.

It is yet another object of this invention to provide such capacitors which provide bond wire connection to the integrated circuit chip, so that the decoupling capacitors are physically connected between the header leads and the integrated circuit chip.

Other objects and advantages of the invention will become apparent to those of ordinary skill in the art having reference to the following specification in conjunction with the drawings.

SUMMARY OF THE INVENTION

The invention may be incorporated into an integrated circuit package having a cavity and an underlying die attach. A capacitor or capacitors are provided which attach to the die attach, along with the integrated circuit chip. A bond wire connects the top of each capacitor to the desired power supply terminal, and a second bond wire connects the top of each capacitor to a power supply pad on the integrated circuit chip. A second embodiment of the invention includes a stacked capacitor, where the upper capacitor is smaller than the lower capacitor so that bond wire connections may be made to the conductive layer at the interface between the upper and lower capacitors.

DETAILED DESCRIPTION OF THE PREFERRED EMBODIMENTS

Figure 1:
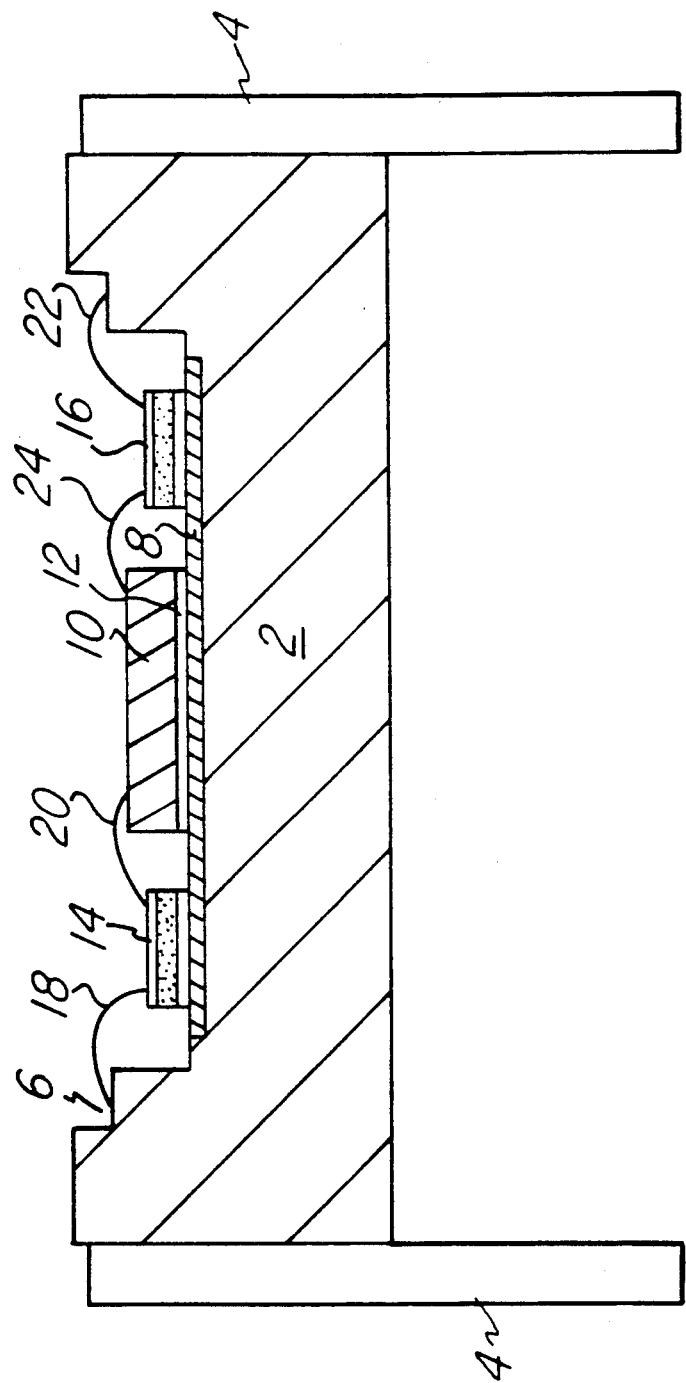
FIG. 1 is a cross-sectional drawing of an integrated circuit package incorporating a first embodiment of the invention.

Referring to FIG. 1, a cross-sectional diagram of a side-brazed ceramic integrated circuit package incorporating a first embodiment of the invention is illustrated. In this example, header 2 is constructed of ceramic material, such as used in high-reliability integrated circuit packages. Leads 4 are, in this example, brazed onto the sides of header 2 and are connected to lead fingers disposed within the cavity of header 2 on a ledge 6 in the conventional manner. Disposed at the bottom of the cavity in header 2 is die attach 8, which is a conductive pad to which integrated circuit chip 10 is attached by way of alloy or epoxy. Die attach 8 is generally gold-plated for high conductivity, and for ease of alloy. Chip 10 is an integrated circuit substrate, which is in this example alloyed to die attach 8 by way of eutectic bonding of chip 10 to die attach 8 via a gold preform. The eutectic alloy bonding is accomplished in the conventional manner, by the placement of a preform upon die attach 8, followed by scrubbing of chip 10 onto the preform with header 2 heated, so that a gold-silicon eutectic is formed. FIG. 1 indicates eutectic region 12 at the interface between chip 10 and die attach 8.

A pair of capacitors 14 and 16 are also assembled into header 2 according to this embodiment of the invention. -Capacitors 14 and 16 are each conventional thin-film capacitors having conductive upper and lower plates and a thin-film dielectric therebetween. An example of a conventional thin-film capacitor used as capacitors 14 and 16 is a MAXI/SLC high capacitance single layer capacitor manufactured and sold by AVX. This example of a thin-film capacitor uses strontium titanate as the dielectric, with the capacitor plates formed of 2 microinches of gold overlying a barrier metal layer of titanium-tungsten, to form a capacitor having the dimensions $0.10 \times 0.17 \times 0.007$ inches. Capacitors 14 and 16, in this embodiment, are also alloy bonded to die attach 8 in the cavity of header 2, in the same manner as chip 10 is attached thereto, i.e., by the melting of a preform between capacitor 14 or 16 and die attach 8. An example of a preform for mounting the above-described example of capacitor is a gold-tin preform 0.002 inches thick, which is heated to a temperature of 330 degrees Celsius for approximately 30 seconds to mount the capacitor into the cavity. In this embodiment, as will be described in further detail below, the value of the capacitors is on the order of 5 to 20 KpF.

Connection of leads 4 to capacitors 14 and 16, and connection to chip 10, is accomplished in this embodiment by conventional wire bonding. The wire bonding technique may be thermocompression ball bonding using gold wire, ultrasonic stitch bonding using aluminum wire, or such other technique as is compatible with the materials used for capacitors 14 and 16, the leads within header 2, and the desired wire material. Wire 18 connects one of leads 4 used as a power supply lead to the upper plate of capacitor 14, and wire 20 connects the top of capacitor 14 in turn to a bond pad on the surface of chip 10, to provide power to the chip from the lead to chip 10. Similarly, wire 22 connects a lead to the upper plate of capacitor 16, and wire 24 connects the top of capacitor 16 to another bond pad at the surface of chip 10. Die attach 8 is generally tied to a lead 4 of header 2, so that bias can be applied thereto from external to the package; alternatively, die attach 8 may be floating if an on-chip substrate bias generator is used to negatively bias the substrate of chip 10 relative to external ground.

Completion of the packaging of chip 10 includes the sealing of a lid (not shown) over the top of the cavity of header 2. It should be noted that other variations for packaging chip 10 and capacitors 14 and 16 may equivalently be used to take advantage of the invention. For example, a glass seal package having a cavity may be used to include capacitors 14 and 16, or other types of packages which may use a lead frame rather than a ceramic header for attachment of the chip 10 and capacitors 14 and 16 may alternatively be used. A plastic molded package, where chip 10 and capacitors 14 and 16 are attached to a lead frame and plastic molded therearound, may also utilize the invention so long as the bond wire length and angle are considered in the molding of the plastic package around the lead frame. Furthermore, other package styles rather than the DIP style (for example, leadless chip carriers, pin-grid arrays, flat-pack packages, and other conventional packaging styles) may incorporate the capacitors according to the invention.

An example of an integrated circuit which can benefit from the invention is an static random-access memory (SRAM) fabricated in silicon-on-insulator technology to provide immunity to single-event upset (SEU) and to transient dose radiation. In such a circuit, the substrate underlying the insulator is preferably externally biased to a potential $V_{bb}$ to bias the bulk substrate underlying the insulator layer. In this case, wire 18 would be connected to the lead 4 associated with the positive power supply $V_{cc}$, which would, via the conductive layer at the top of capacitor 14 and via wire 20, supply the integrated circuit with bias and current required for operation of the circuit. Similarly, wire 22 is connected between a lead 4 associated with the ground, or reference power supply $V_{ss}$ and the top of capacitor 16. In turn, wire 22 connects the potential of $V_{ss}$ provided at the top of capacitor 16 to a bond pad at the surface of chip 10 to provide the reference supply thereto.

Figure 2:
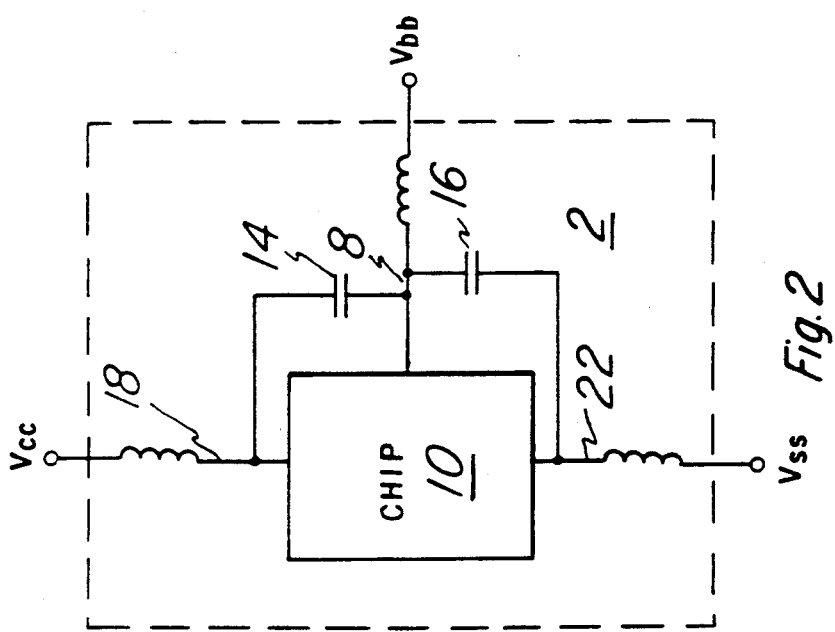
FIG. 2 is a schematic drawing, in electrical form, of the equivalent circuit to the embodiment of FIG. 1.

Referring now to FIG. 2, an electrical schematic of the equivalent circuit of FIG. 1, including the parasitic inductance, is illustrated. With the bias scheme described above, the parasitic inductance associated with the bond wires 18 and 22, as well as with the runs and leads of header 2, are illustrated by the inductor symbols thereat for $V_{cc}$ and $V_{ss}$. Similarly, an inductance is present between die attach 8 and its run within header 2 to the $V_{bb}$ lead 4; if chip 10 contains an on-chip substrate bias generator with die attach floating, very little parasitic inductance associated with the $V_{bb}$ bias will be present external to chip 10. The boundaries of header 2 are schematically illustrated by the dashed lines in FIG. 2. As shown in FIG. 2, the first embodiment of the invention provides for decoupling between $V_{cc}$ and $V_{ss}$ by way of the series connection of capacitors 14 and 16, with $V_{bb}$ also decoupled therebetween at the common connection through die attach 8.

It is preferable for purposes of decoupling both power supply noise and for minimization of power supply voltage sag during a transient dose event that the decoupling capacitors decouple the noise to $V_{ss}$, which is generally the system ground. While the arrangement of the first embodiment of the invention shown in FIGS. 1 and 2 is useful, the series connection of capacitors 14 and 16 between $V_{cc}$ and $V_{ss}$ is less preferable than if capacitors 14 and 16 were connected in parallel. For example, if the values of capacitors 14 and 16 are each 10 KpF, the total decoupling capacitance between $V_{cc}$ and $V_{ss}$ is reduced to 5 KpF. The second embodiment of the invention described hereinbelow is directed to improving this decoupling by providing such parallel capacitance.

Figure 3:
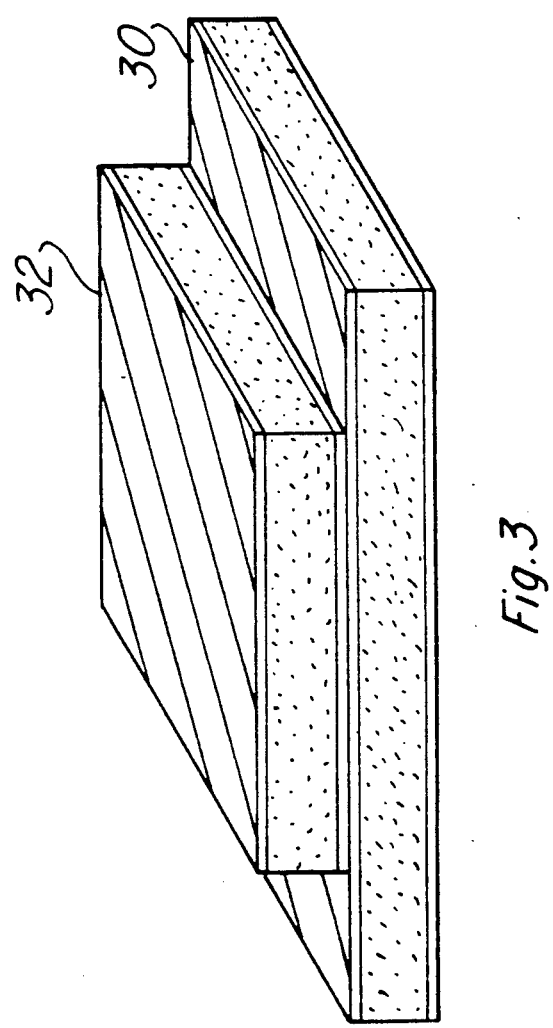
FIG. 3 is a perspective view of a double capacitor as will be incorporated into a second embodiment of the invention.

FIG. 3 illustrates a stacked thin-film capacitor pair 30, 32 which is incorporated into the second embodiment of the invention. Upper capacitor 32 is a thin-film capacitor, such as the strontium titanate capacitor having conductive plates of gold separated from the dielectric by a barrier layer of titanium tungsten described for capacitors 14 and 16 used in the first embodiment hereinabove. Upper capacitor 32 is bonded to the upper surface of lower capacitor 30. Capacitor 30 is a second thin-film capacitor such as capacitor 32, but has a larger cross-sectional area than that of capacitor 30. In this example, if upper capacitor 32 is of dimensions 0.10×0.17×0.007 inches, lower capacitor 30 may be larger along a single dimension, e.g., 0.10×0.25×0.007 inches Lower capacitor 30 may use the same dielectric as upper capacitor 32, but since the primary decoupling of interest is between $V_{cc}$ and $V_{ss}$, another dielectric type may be used for purposes of cost reduction, if desired. Capacitors 30 and 32 are in this example individually formed capacitors which are alloyed together by way of a gold-tin preform, similarly as capacitors 14 and 16 are mounted to die attach 8 in the prior embodiment; alternatively, a conductive epoxy or other technique may be used. Alternatively, capacitors 30 and 32 may be integrally formed so that the upper conductive surface of capacitor 30 is physically the same layer as the lower conductive surface of capacitor 32.

Figure 4:
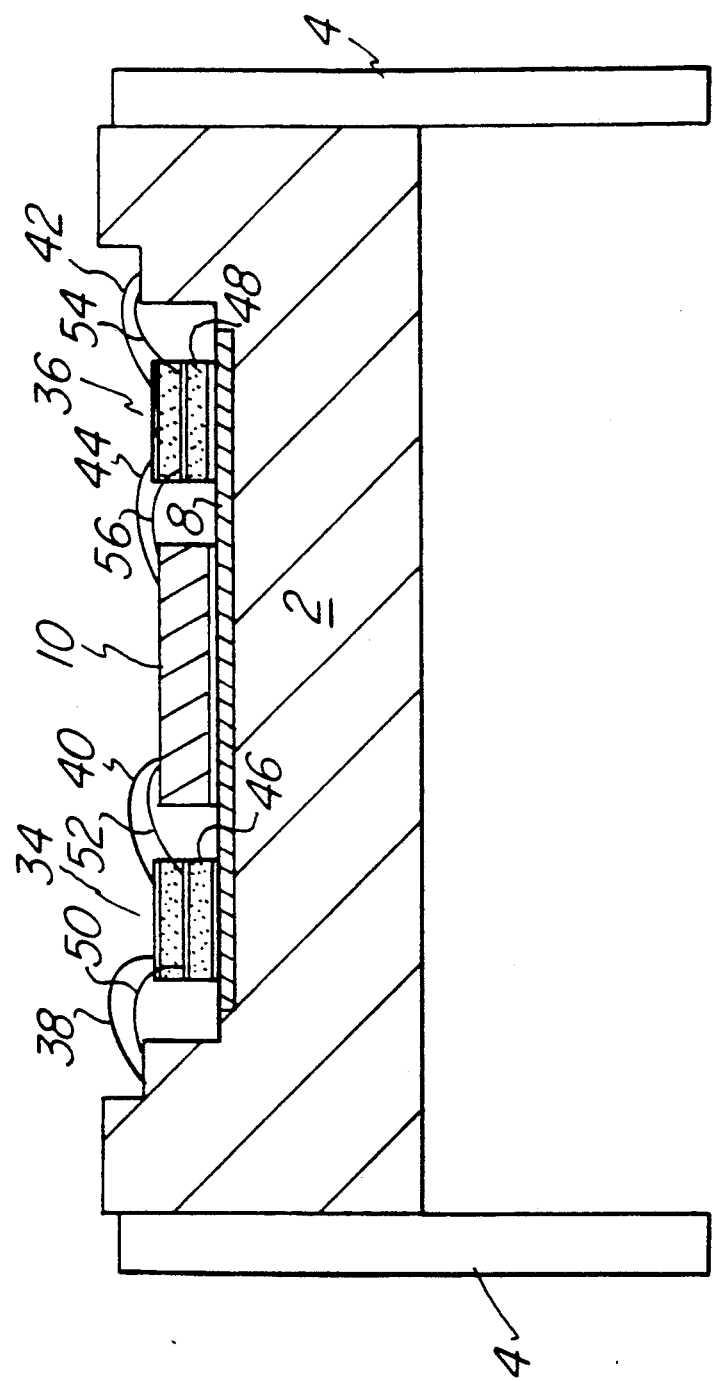
FIG. 4 is a cross-sectional drawing of an integrated circuit package incorporating a second embodiment of the invention.

Referring now to FIG. 4, a cross-sectional view of a packaged integrated circuit according to the second embodiment of the invention, and incorporating the stacked capacitor of FIG. 3, is illustrated. Chip 10 is mounted eutectically or otherwise on die attach 8 as described hereinabove. A stack of capacitor 46 and capacitor 34 is similarly mounted onto die attach 8, with the bottom surface of capacitor 46 in contact with die attach 8, via alloy or epoxy mounting as described above. Capacitor 34 has a smaller cross-sectional area than capacitor 46, so that connection may be made to the top surface of capacitor 46 with bond wire 50 from header 2 and bond wire 52 to chip 10. Bond wire 38 connects a lead 4 of header 2 to the top surface of capacitor 34, and bond wire 40 connects the top surface of capacitor 34 to a bond pad of chip 10. While a single pair of capacitors 34 and 46 are operable to provide power supply decoupling between $V_{cc}$ and $V_{ss}$, as well as between $V_{bb}$ and $V_{ss}$, if space permits as in this example, a second stacked pair of capacitors 48 and 36 are also mounted into the cavity of header 2. Similarly as capacitors 34 and 46, the lower surface of capacitor 48 is mounted to die attach 8, and the upper surface is wire bonded by way of wires 54 and 56 to header 2 and chip 10, respectively. Capacitor 36 has a smaller cross-sectional area than capacitor 48, so that the conductive upper surface of capacitor 48 is available for such bonding. The conductive upper surface of capacitor 36 is connected by way of wire bonds 42 and 44 to header 2 and chip 10, respectively.

Figure 5:
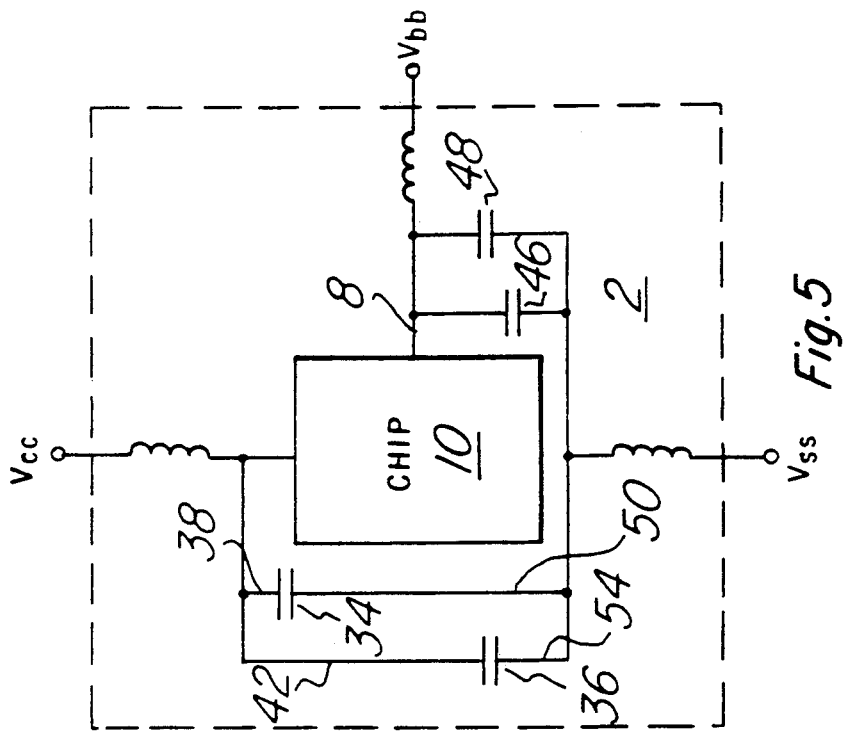
FIG. 5 is a schematic drawing, in electrical form, of the equivalent circuit to the embodiment of FIG. 4.

FIG. 5 is an electrical schematic of the arrangement of FIG. 4. As described above, it is preferable from a decoupling standpoint to have $V_{cc}$ and $V_{ss}$ capacitively coupled together by capacitors in parallel; noise on $V_{bb}$ may also be decoupled by providing capacitive coupling therebetween. In the arrangement of FIG. 4, this is accomplished by connecting the top surfaces of the top capacitors 34 and 36 to $V_{cc}$, and by connecting the top surfaces of capacitors 46 and 48 (and therefore the bottom surfaces of capacitors 34 and 36) to $V_{ss}$, in the case where the substrate and die attach 8 is biased to $V_{bb}$. Therefore, wires 38 and 42 are connected to leads 4 of header 2 which receive $V_{cc}$, and wires 50 and 54 are connected to leads 4 of header 2 which receive $V_{ss}$. The resulting electrical schematic of FIG. 5 shows that capacitors 36 and 34 are thus connected in parallel between $V_{cc}$ and $V_{ss}$, providing good decoupling therebetween Similarly, capacitors 46 and 48 are connected in parallel between $V_{bb}$ (at die attach 8) and $V_{ss}$, to also provide good decoupling therebetween.

Figure 6:
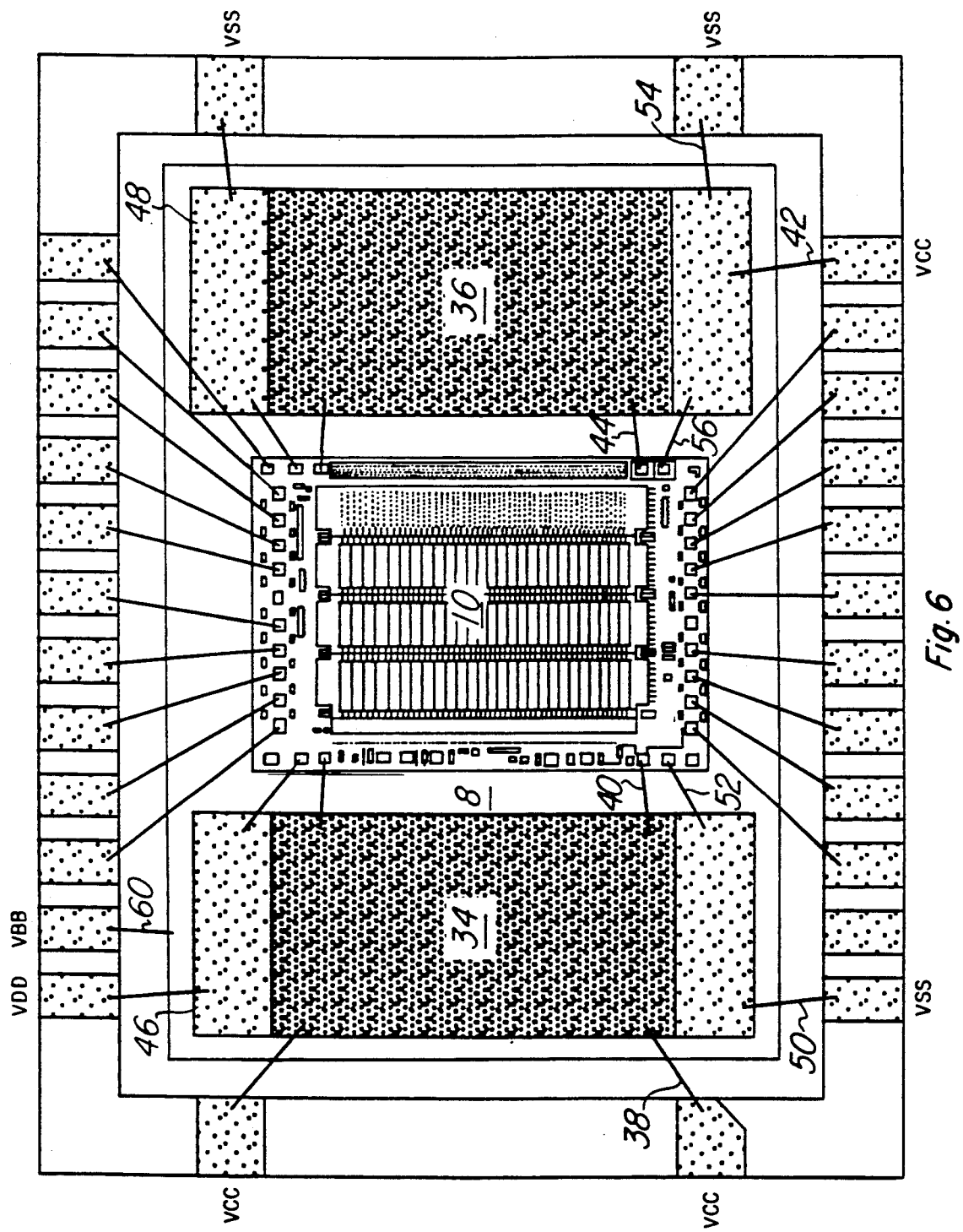
FIG. 6 is a plan view of the integrated circuit package of FIG. 4.

FIG. 6 illustrates a plan view of an integrated circuit incorporating the arrangement of FIGS. 4 and 5. FIG. 6 illustrates that connection between $V_{bb}$ and a lead may be made by way of a wire bond 60; it should be noted, however, that connection between die attach 8 and the $V_{bb}$ lead is often made by way of a connection internal to header 2. In this example, two $V_{cc}$ bonds and two $V_{ss}$ bonds are made at each end of header 2 and chip 10, as shown. The multiplicity of bonds for the power supply leads provide reduced inductance at chip 10, further reducing the generation of noise. It should also be noted that none of the bond wires necessary in making this arrangement need be excessively long, since the use of the conductive surfaces of capacitors 34, 36, 46 and 48 to carry power to chip 10 can keep the power supply bond wires short.

As described above, the formation of the capacitors into an integrated circuit package according to the above-described embodiments is done with the same techniques as used in the packaging of the integrated circuit chip itself This provides for efficient and low-cost manufacturing of the resulting structure having the improved decoupling schemes described herein, with the capacitors placed as close as possible to the integrated circuit chip.

Although the invention has been described in detail herein with reference to its preferred embodiments, it is to be understood that this description is by way of example only, and is not to be construed in a limiting sense. It is to be further understood that numerous changes in the details of the embodiments of the invention, and additional embodiments of the invention, will be apparent to, and may be made by, persons of ordinary skill in the art having reference to this description. It is contemplated that such changes and additional embodiments are within the spirit and true scope of the invention as claimed below.

I claim:

1. A semiconductor packaged device, comprising:
a semiconductor chip formed on a semiconductor substrate disposed within a cavity of a semiconductor package, the semiconductor package having a positive power supply terminal coupled to the semiconductor chip and having a negative power supply terminal coupled to the semiconductor chip;

a first capacitor stack and a second capacitor stack disposed within the cavity and connected in parallel between the positive power supply terminal and negative power supply terminal and also connected in parallel between the negative power supply terminal and the substrate of the semiconductor chip.

2. The semiconductor packaged device of claim 1 wherein the first capacitor stack comprises:

first and second thin film capacitors, one plate of the first thin film capacitor being connected to the positive power supply terminal, one plate of the second thin film capacitor being connected to the substrate of the semiconductor chip, the first and second thin film capacitors being joined together by common plate that is connected by means to the negative power supply terminal.

3. The semiconductor packaged device of claim 2 wherein the means for connecting the common plate of the first capacitor stack to the negative power supply terminal is a wire bonded to the common plate and bonded to the negative power supply terminal; and wherein the first thin film capacitor lies on top of the second thin film capacitor and the common plate has a larger cross sectional area than the cross sectional area of the plate of the first thin film capacitor to facilitate bonding the wire to the common plate.

4. A semiconductor packaged device, comprising:

a body having a cavity;

a conductive die attach pad disposed within the cavity;

a semiconductor chip that is operable in response to a positive voltage, a ground voltage, and a substrate bias voltage, that is attached to the conductive die attach pad and is disposed within the cavity;

a capacitor stack disposed within the cavity having two thin film capacitors;

another capacitor stack disposed within the cavity having two thin film capacitors;

wherein one thin film capacitor of the a capacitor stack and one thin film capacitor of the another capacitor stack is for parallel capacitively coupling the positive voltage and the ground voltage to the semiconductor chip; and wherein the other thin film capacitor of the a capacitor stack and the other thin film capacitor of the another capacitor stack is for parallel capacitively coupling the ground voltage and the substrate bias voltage to the semiconductor chip.

5. The semiconductor packaged device of claim 4 wherein the two thin film capacitors of the a capacitor stack are joined together by a common plate and the common plate is for coupling the ground voltage to the semiconductor chip.

* * * * *